United States Patent [19]

Parmentier et al.

[11] Patent Number: 4,731,645
[45] Date of Patent: Mar. 15, 1988

[54] CONNECTION OF A SEMICONDUCTOR TO ELEMENTS OF A SUPPORT, ESPECIALLY OF A PORTABLE CARD

[75] Inventors: Paul Parmentier, Cailly sur Eure; Philippe Jourdan, Evreux, both of France

[73] Assignee: U.S. Philips Corporation, New York, N.Y.

[21] Appl. No.: 873,875

[22] Filed: Jun. 12, 1986

Related U.S. Application Data

[63] Continuation of Ser. No. 782,322, Oct. 2, 1985, abandoned, which is a continuation of Ser. No. 492,778, May 9, 1983, abandoned.

[30] Foreign Application Priority Data

May 14, 1982 [FR] France .................. 82 08430

[51] Int. Cl.$^4$ ............................................. G06K 7/06
[52] U.S. Cl. .................................... 357/80; 235/380; 235/441; 283/83; 283/904; 357/85
[58] Field of Search ............... 235/380, 441, 443, 487, 235/492; 283/83, 904; 357/80, 85

[56] References Cited

U.S. PATENT DOCUMENTS

| | | | |
|---|---|---|---|
| 4,222,516 | 9/1980 | Badet et al. | 235/492 |
| 4,417,413 | 11/1983 | Hoppe et al. | 235/441 |
| 4,463,971 | 8/1984 | Hoppe et al. | 235/487 |
| 4,544,989 | 10/1985 | Nakabu et al. | 357/81 |
| 4,549,247 | 10/1985 | Hoppe et al. | 235/487 X |

FOREIGN PATENT DOCUMENTS

| | | | |
|---|---|---|---|
| 7705769 | 2/1977 | France. | |
| 2382101 | 10/1978 | France | 357/80 |

Primary Examiner—John Lee
Attorney, Agent, or Firm—Norman N. Spain

[57] ABSTRACT

There is started from an entirely insulating support (2), of which a part (7, 8) is very thin; a chip (5) of an integrated circuit is arranged so that its metallizations are opposite the holes (4) provided in the thin support beforehand, and the conducting tracks (9) and the contacts with the integrated circuit are obtained in one operation by means of a conducting paste applied by screen printing, which covers the holes and penetrates into them in order to establish a contact with the chip.

1 Claim, 7 Drawing Figures

CONNECTION OF A SEMICONDUCTOR TO ELEMENTS OF A SUPPORT, ESPECIALLY OF A PORTABLE CARD

This is a continuation of application Ser. No. 783,322, filed Oct. 2, 1985 now abandoned, which is a continuation of application Ser. No. 492,778, filed May 9, 1983, now abandoned.

BACKGROUND OF THE INVENTION

1. Field of the Invention

The invention relates to a method of establishing an electrical connection between metallizations of a semiconductor wafer and conductor tracks, which may be of metal, carried by a surface of a support, in which the thin support is provided with holes having a configuration corresponding to that of the metallizations on the wafer.

The method according to the invention can advantageously be used for the realization of a portable card having a semiconductor circuit, especially a credit card or an identity card, comprising flat conductor elements constituted by a conducting paste and connected to the terminals of the semiconductor circuit so that an electrical connection can be established with an external member and in which material the semiconductor circuit is directly included in the form of a semiconductor wafer, the terminals of which are constituted by metallizations.

The thin supports used in accordance with the invention are utilized in the electronic industry for providing a semiconductor wafer on a complex electronic circuit, while ensuring the mechanical strength as well as the electrical interconnection of the wafer.

2. Description of the Prior Art

The term "semiconductor circuit wafer" or in abbreviated form "semiconductor wafer" is to be understood herein as one of the elements obtained by cutting slices of semiconductor material, on which integrated circuits have been formed (these elements are generally designated in the professional language as "chips").

A solution for providing a wafer in a circuit consists in that a film is utilized which is retained in the finished product and which provides for the insulation with respect to the edges of the wafer due to its location between the conducting strip or track on one of the surfaces and the wafer on the other side. Such a solution is described in French Patent Application No. 2382 101 and is more particularly illustrated in its FIG. 3. In this case, use is made of a thin support (5) whose conductor tracks (4) are connected through metallized holes (6) to other conductor tracks on the other surface, which in turn is soldered to the metallizations (3) of the wafer (2).

However, this solution, which is excellent after all from a technical point of view, is expensive due to the use of two metallized surfaces, which requires two etching steps and the provision of metallized holes.

SUMMARY OF THE INVENTION

The present invention mainly has for its object to provide a method by which high-quality devices can be obtained at an extremely low cost price. Due to this low cost price, the method can be used for the large scale manufacture of devices, such as portable cards, for example credit cards or identity cards. It can also be used for mounting supports of integrated circuits that can be utilized in economical assemblies and especially when a reduced volume is required, such as, for example, in watches or pocket calculators.

The general concept of the invention is based on the idea that it is possible to establish an electrical contact between a metallization of the wafer and a conductor track on the other surface of the thin support by filling the hole with a conducting paste which spreads to the conductor track. On the contrary, on the side of the wafer, the paste cannot spread from the hole because the wafer is arranged against the support. This is one of the great advantages of the invention with respect to given conventional solutions, such as the arrangement of the wafers so that their surface is directed downward with the use of glued contacts. Thus, a method according to the invention is especially characterized in that, the conducting tracks being disposed so that they comprise parts adjoining the said holes and the second surface of the support opposite to that carrying the metallizations being wholly insulating, the wafer is placed on this second surface so that its metallizations face this second surface and correspond to the said holes, and in that there is deposited from the first surface a conducting material in the holes by causing this material to spread laterally to the conductor tracks.

The advantage of this solution is that it starts from a support which comprises metallizations only on one side and which consequently is current and inexpensive while nevertheless permitting an insulation between the conductor tracks and the edge of the wafer without the formulation of excessively thick parts being required.

When proceeding in the same way, moreover the said conductor tracks can be realized from the same conducting material that is deposited on the holes in one operation.

Thus, in an even more economical modification, the method according to the invention is especially characterized in that, starting from a completely insulating support, the wafer is placed on a surface of the support so that its metallizations face this surface and correspond to the said holes, and in that then the tracks are formed on the other surface by means of a conducting paste, by giving them a configuration such that parts of tracks cover the holes so that the paste penetrates into them, thus coming into contact with the metallizations of the wafer.

This method is of an ideal simplicity and can be used with a support not metallized beforehand. Therefore, it is very economical.

The U.S. Pat. No. 4,222,516 proposes to realize an electronic card by incorporating therein a small flat sub-assembly provided with conductor tracks ensuring the mechanical strength and the electrical connections of a semiconductor wafer; said sub-assembly being moreover provided with flat conducting elements connected to the said tracks, these flat conducting elements serving as contact areas are made to appear through orifices of the card, which may be filled with conducting material. These orifices are too deep to be provided with conducting material by a silk-screen process and moreover they do not give direct access to the wafer. On the contrary, in order to establish the connection between the wafer and the tracks of the support, conventional means (beams designated by the abbreviation T.A.B.) are utilized. This device comprises a large number of successive intermetallic contacts between an external connection and a metallization of the wafer, the assembly implying a large number of manufacturing steps and a given complexity of the circuit.

It should be noted that the relevant small sub-assembly is then advantageously manufactured according to the method of the present invention.

This method is also used advantageously for the manufacture of a portable card comprising flat conducting elements connected to the terminals of a semiconductor circuit directly included in the form of a wafer in the material of the card and is especially characterized in that said wafer is arranged very close to a surface of the card so that its metallizations face said surface, thus constituting a thin wall opposite the wafer, in that holes are provided in this thin wall opposite the metallizations of the wafer, and finally in that simultaneously with the formation of the aforementioned flat conducting elements, the conducting paste is caused to spread from each conductor element to the relevant metallization of the wafer by causing it to penetrate into the holes.

With this method, the card in itself constitutes the aforementioned "thin support", which provides a remarkable simplicity of construction and a particularly low cost price.

BRIEF DESCRIPTION OF THE DRAWINGS

In order that the invention may be readily carried out, it will now be described more fully with reference to the accompanying drawings, in which.

DESCRIPTION OF THE PREFERRED EMBODIMENT

Figure 1:
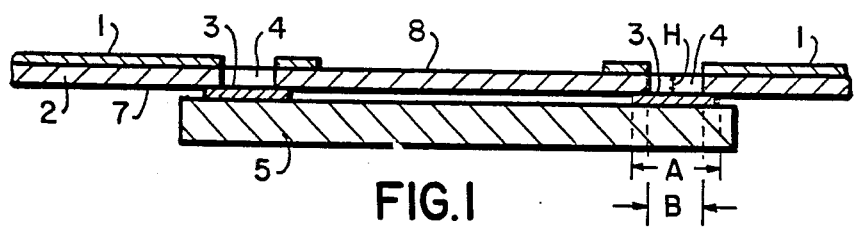
FIG. 1 is a sectional view of a thin support, below which is arranged a semiconductor wafer before deposition of conducting material.

FIG. 1 shows a semiconductor wafer 5 provided with metallizations 3 and a thin support 2 provided with metal conductor tracks 1 carried by a first surface 8 of this thin support. There are provided in this support holes 4 having a configuration corresponding to that of the metallizations 3 on the wafer.

The holes in the support are disposed so that, when the wafer is placed against the support with an adequate positioning, there is a hole of the support opposite each metallization of the wafer. The conducting tracks 1 are disposed so that they comprise parts adjoining the holes. These parts adjoining the holes are preferably constituted by rings surrounding the holes and usually designated as lunulea. The support and the tracks are constituted by a conventional thin so-called single-sided printed circuit board, on which a large number of wafers is mounted and which is cut into small pieces each comprising either one wafer or several interconnected wafers.

The support may also be constituted by a film in the form of a strip which may be provided with positioning holes and carries metal tracks deposited on one of its surfaces. This film provided with wafers by the method according to the invention and wound onto a coil is utilized in a machine which cuts it and provides an electronic circuit parts of the film each provided with one wafer.

In order to ensure an efficient use of the method according to the invention, it is of importance that given dimensional proportions are taken into account. It is particularly favorable when the thickness H of the support is comparatively small with respect to the dimension of the holes, the latter being of the same order of magnitude as that of the metallizations.

When a conventional printed circuit technology is used for obtaining the support 2, for example, of epoxy glass, it is possible to provide in a usual manner circular holes of a diameter $B=0.4$ mm. The thickness H being equal to, for example, 0.1 mm, a hole is thus obtained which is four times wider than its depth.

The metallizations 3 of the wafer are slightly larger. For example, they may have a width A of 0.5 mm. This is a dimension considerably larger than is usual for integrated circuits. It should be appreciated that the invention is preferably applied to integrated circuits having a high complexity, but nevertheless comprising a reduced number of input/output metallizations. This is the case, for example, for circuits used for credit cards, which offer multiple and complex logic functions and comprise only eight or even only six terminals. Let it be assumed, for example, that a wafer carrying such a circuit has a surface area of 15 $mm^2$ with six metallizations of 0.1 mm$\times$0.1 mm. If the dimension of these metallizations is brought to 0.5$\times$0.5 mm, the surface area is increased by 1.44 $mm^2$, i.e. hardly 10% of the overall surface area of the wafer. The price of a wafer is increased by approximately the same amount, but the gain obtained owing to the simplification of mounting is larger than the increase of the price of the wafer, and in the end the product becomes less expensive.

It is also possible to provide smaller holes owing to the use of a laser. However, in order to maintain a reasonable positioning tolerance as well as a sufficient ratio B/H, it is also in this case advantageous to use metallizations slightly larger than is usual. For example, holes $B=0.2$ mm may be provided and metallizations with $A=0.3$ mm may be used, the thickness H still being 0.1 mm. In the above embodiment, this would correspond to an increase in surface area of the wafer of only 3.2%.

Figure 2:
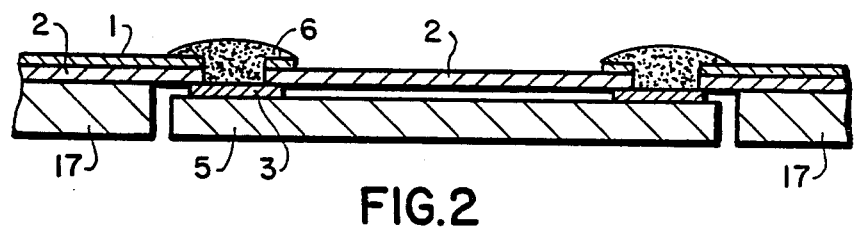
FIG. 2 is a sectional view of the same device as in FIG. 1, but after deposition of conducting material.

Starting from such a support and such a wafer and the second surface 7 of the thin support opposite to the surface 8 which carries the metallizations being entirely insulating, the wafer 5 is placed on this second surface 7 so that its metallizations 3 face this second surface and correspond to the holes 4, while, as shown in FIG. 2, an island of conducting polymerizable paste 6 is deposited from the first surface 8 on each hole so that the metallization placed under the hole and the conducting track 1 adjoining the said hole are covered at the same time.

This paste is then removed preferably by the use of a screen or a stencil plate and a scraper. The screen is constituted, for example, by a tissue covered with a photo-etched coating by the known so-called silkscreen process. In this case, the wafer and the support are held in place during the deposition of the paste by known mechanical means, for example, a slice provided with holes and a suction member, after which the viscosity and the adherence of the paste are sufficient to hold the wafer during the subsequent manipulations until the polymerization of the paste is ensured, for example, by heating in a furnace.

In this case, the metallizations of the wafer are preferably constituted by a stack of titanium/platinum/gold which gives satisfactory results with most of the conducting pastes commercially available.

The wafer may also be held owing to a support 17 having a thickness equal to or slightly smaller than that of the wafer 5. A wall not shown is fixed to the inner surface of the device and holds the wafer in place at least during the deposition and, as the case may be, the polymerization of the conducting material 6. This wall may be made, for example, of an adhesive tape.

The wafer may also be held by a ribbon of a suitable material deposited along the perimeter of the wafer between the latter and the support 17. Such a material may be an insulating polymerizable paste or a glass that can be fused at low temperature. This measure has the advantage that afterwards a climatic protection of the wafer is obtained.

The support 17 may be glued to the support 2, for example by means of a method known as a method of pressing printed multilayer circuits.

Figure 4:
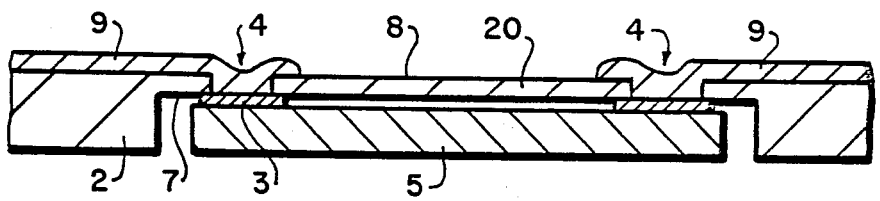
FIG. 4 is a sectional view of a device analogous to that of FIG. 2 obtained by a modification of the method according to the invention.

Instead of a flat thin support 2 and a support 17, use may also be made, as shown in FIG. 4, of a support consisting of a single part 2, in which a cavity is provided for receiving the wafer 5. This cavity has no orifice and a wall 20 is left constituting the thin support proper. This support is less expensive than that of FIG. 2 because it utilizes only one plate and a pressing operation is dispensed with.

This support may also be made of a ceramic material, which has several advantages: the cavity can then be obtained, like the holes, directly by moulding and, in order to ensure an optimum tightness along the perimeter of the wafer, a glass can be utilized that can be fused at a temperature which can reach 300° to 400° C., the various expansion coefficients (silicon, glass ceramic) being accurately matched to each other.

In order to perfect the idea of the invention, an entirely insulating support is used, as is designated by reference numeral 2 in FIG. 4, the wafer 5 is placed on a surface 7 of this support so that its metallizations 3 face this surface and correspond to the holes 4 and then the tracks 9 are formed on the other surface by means of a conducting pase while giving them a configuration such that track parts cover the holes 4 so that the paste penetrates into them, thus coming into contact with the metallizations 3 of the wafer. These tracks 9 are preferably deposited by means of a silk-screening process.

Of course it is not essential that the support for track 9 consists of a single layer 2 (FIG. 4). As is shown in FIG. 2 the support for track 1 is constituted by two juxtaposed layers 2 and 17. It stands to reason that each of the two types of support may be utilized indifferently with each of the types of conducting tracks.

Figure 3:
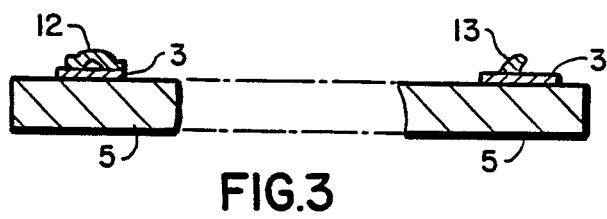
FIG. 3 shows two fragments of a semiconductor wafer each carrying a metal wire.

FIG. 3 shows parts of the wafer 5 with metallizations 3. To each metallization is soldered a metal wire part before cutting slices of semiconductor material which provide the wafer. On the lefthand side of the Figure, a wire 12 is soldered at two adjacent points to the same metallization, thus forming a kind of basket handle, which improves the subsequent adhesion of the solder or the glue. On the right hand side of the Figure, a wire has been soldered while constituting a ball, which wire is cut immediately so as to be flush with said ball. This also promotes the adhesion of the conducting material to the metallizations. It should be appreciated, however, that these measures, which serve only to obtain a higher efficiency and a higher reliability, are not indepensable for the application of the invention.

In the case in which the product to be manufactured is an electronic portable card, of the kind mentioned in the preamble, instead of including a support in the card, the latter may advantageously be realized so that it itself directly constitutes the support of the semiconductor wafer.

Such a card has flat conducting elements (10, FIG. 7) which serve to establish electrical contacts with an apparatus by means of which the card is scanned. These flat conducting elements can be realized by means of a conducting paste and have to be joined together at the terminals of the semiconductor circuit directly included in the card.

Figure 5:
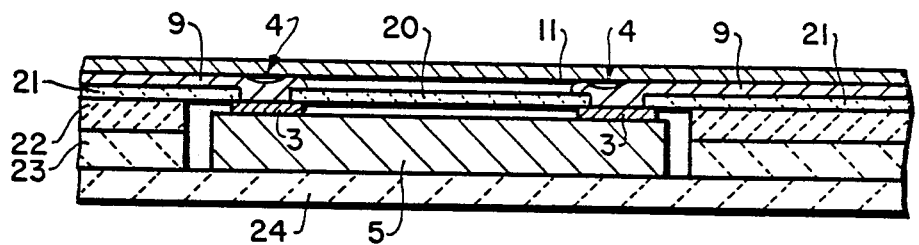
FIG. 5 is a sectional view of a portable card obtained by the method according to the invention.

FIG. 5 shows stacked plates 21, 22, 23, 24. The central plates 22 and 23 have a thickness substantially equal to that of the wafer 5. The two outer layers 21 and 24 permit of enclosing the wafer 5 in the assembly. This stack once having been hot-pressed with the wafer 5 inside it, the latter is located very close to a surface of the card, in this case the upper surface, so that its metallizations 3 face the said surface. Thus, a thin wall 20 has been formed opposite the wafer. Before the pressing of the stack, holes 4 have been provided in this thin wall and the plate 21 has been arranged so that these holes are located opposite the metallizations 3 of the wafer. The plates 21 to 24 constituting the card may consist of polyvinyl chloride (PVC) and pressed according to the usual technique for manufacturing portable cards with magnetic tracks. They may also consist of laminated epoxy and glass fiber, as is used for realizing multilayer printed circuits and pressed according to the technique for these circuits. Further, the assembly corresponding to the plates 21, 22, 23 may be formed in one piece, for example, by moulding it from one of the numerous materials that can be transfer-moulded. The holes 4 will then be formed by moulding. The wafer 5 will then be positioned, for example, glued to the plate 24, while the latter in turn will be glued to the assembly 21, 22, 23.

The assembly once having been constituted with the wafer inside it, the aforementioned flat conducting elements are formed by screen printing a conducting paste at a low polymerization temperature, while simultaneously with the formation of these elements the conducting paste is caused to spread from each element to the relevant metallization of the wafer by causing it to penetrate into the holes. Thus, the design of the conductors formed by means of screen printing is such that a unique pattern is constituted by an aforementioned flat conductor and a conducting track connecting it to the wafer of the integrated circuit and that each track covers a hole so that its material penetrates into it and comes into contact with a metallization of the wafer.

A protective sheet 11 can finally be glued to the stack in order to protect the tracks 9 and the flat conducting elements. Of course, orifices are provided in this sheet 11 to give access to the flat conductors.

Figure 6:
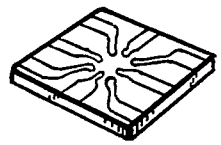
FIGS. 6 and 7 are perspective views of embodiments of devices obtained by the method according to the invention.

FIG. 6 shows a support of an integrated circuit manufactured by means of the method according to the invention and intended to be utilized in an electronic sub-assembly or further to be included in a portable card.

Figure 7:
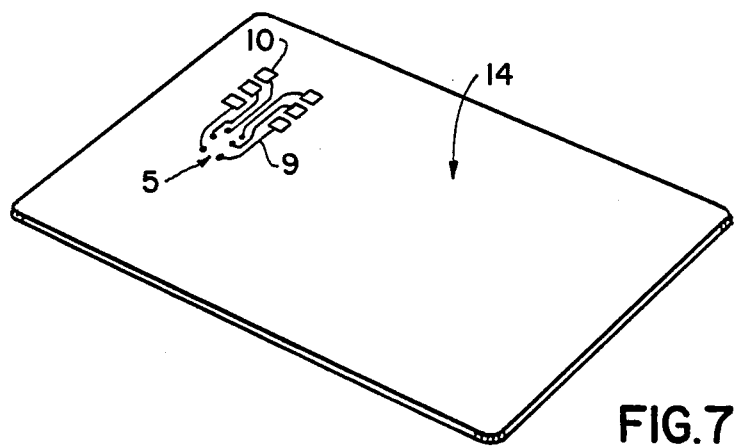

FIG. 7, which shows a portable card directly constituting the support of a wafer of an integrated circuit, clearly illustrates the configuration of the conductors. The aforementioned flat conducting elements are indicated at 10 and the tracks at 9. The latter terminate in rounded areas above each hole in order to establish contact with the "buried" wafer, whose position is indicated by the arrow 5.

It is a matter of course that the method according to the invention is preferably used in a so called "multiple" manufacturing process, that is to say that a slice or a strip is manufactured which comprises a large number of devices of the kind shown in FIG. 6 or 7 and that at the very end of the process the slices or strips are cut in order to obtain individual devices.

What is claimed is:

1. An identity card provided with flat conducting elements situated on an external surface of a wall of said card, which conducting elements are connected to metallized termination areas of a semiconductor wafer so that an electrical connection can be established with a member separate from said wall characterized in that:
   said conducting elements are constituted by a polymerized conducting material;
   the semiconductor wafer is situated within said card and is positioned so that its metallized termination areas face said wall;
   said wall is provided with holes opposite said metallized termination areas; and
   parts of said flat conducting elements each penetrate into one of said holes while contacting the metallized terminal area positioned opposite said hole and covering at least in part said hole, thus providing electrical contact between said metalized termination area opposite said hole and said flat conducting element at least partially covering said hole.

* * * * *